(12) United States Patent
Lee et al.

(10) Patent No.: US 6,818,510 B2
(45) Date of Patent: Nov. 16, 2004

(54) NON-VOLATILE MEMORY DEVICE AND METHOD FOR FABRICATING THE SAME

(75) Inventors: Chang-Hyun Lee, Kyunggi-do (KR); Jung-Dal Choi, Kyunggi-do (KR); Byung-Kwan You, Seoul (KR); Sung-Hoi Hur, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/704,285

(22) Filed: Nov. 6, 2003

(65) Prior Publication Data

US 2004/0094776 A1 May 20, 2004

Related U.S. Application Data

(62) Division of application No. 10/188,389, filed on Jul. 1, 2002, now Pat. No. 6,677,639.

(30) Foreign Application Priority Data

Jul. 21, 2001 (KR) ........................................ 2001-44054

(51) Int. Cl.$^7$ .............................................. H01L 21/336
(52) U.S. Cl. ...................................... 438/265; 257/314
(58) Field of Search ................................ 438/257, 259, 438/265, 296, 424, 593, 700; 257/314, 510, 321, 322

(56) References Cited

U.S. PATENT DOCUMENTS

| | | | |
|---|---|---|---|
| 5,548,145 A | 8/1996 | Hamamoto et al. | 257/301 |
| 5,949,101 A | 9/1999 | Aritome | 257/315 |
| 6,057,580 A | 5/2000 | Watanabe et al. | 257/396 |
| 6,066,740 A * | 5/2000 | Godlewski et al. | 548/347.1 |
| 6,222,225 B1 * | 4/2001 | Nakamura et al. | 257/315 |
| 6,274,434 B1 | 8/2001 | Koido et al. | 438/266 |
| 6,342,715 B1 | 1/2002 | Shimizu et al. | 257/314 |
| 6,476,438 B2 | 11/2002 | Shimizu | 257/314 |

* cited by examiner

*Primary Examiner*—David Nelms
*Assistant Examiner*—David Vu
(74) *Attorney, Agent, or Firm*—Marger Johnson & McCollom, P.C.

(57) ABSTRACT

A non-volatile memory device and fabrication method thereof are provided. A floating region is formed on an active region on a substrate. Trenches define the active region. The floating region is made of an ONO layer. A gate electrode is formed on the floating region. A mask is formed on the gate electrode. A thermal oxidation is performed to make a sidewall oxide and a trench oxide on the sidewall of the gate electrode and the trench, respectively. As a result, the widths of the gate electrode and the active region become less than the width of the floating region, thereby forming protrusions at ends of the floating region. Isolation regions are formed in the trenches and include the sidewall oxide and the trench oxide. The isolation regions surround the protrusions. As a result, electric field induced on the sidewall of the floating region is decreased. Moreover, the thermal oxidation cures any damage to the sidewalls of the floating region. Accordingly, leakage current can be substantially suppressed at the boundary region between the isolation region and the floating region.

17 Claims, 7 Drawing Sheets

(Prior Art)

Fig. 3

(Prior Art)

Fig. 4

(Prior Art)

Fig. 5

(Prior Art)

NON-VOLATILE MEMORY DEVICE AND METHOD FOR FABRICATING THE SAME

This application is a divisional of U.S. patent application Ser. No. 10/188,389 filed Jul. 1, 2002, now U.S. Pat. No. 6,677,639, which is herein incorporated by reference in its entirety.

FIELD OF THE INVENTION

The present invention relates to semiconductor devices and fabrication methods thereof and, more particularly, to floating trap type non-volatile memory devices and to fabrication methods thereof.

BACKGROUND OF THE INVENTION

A non-volatile memory device is an advanced type of memory device that retains information stored in its memory cells even when no power is supplied. Nowadays, the non-volatile memory device is widely used in various kinds of electronic products like as a cellular phone, a memory card and so on.

As one of the non-volatile memory devices, a floating trap type non-volatile memory device comprises a gate electrode, a semiconductor substrate and a floating trap region. The floating region is interposed between the gate electrode and the substrate. During device operation to store or erase date, electrons are trapped into the floating region or discharged from the floating region.

Figure 1:
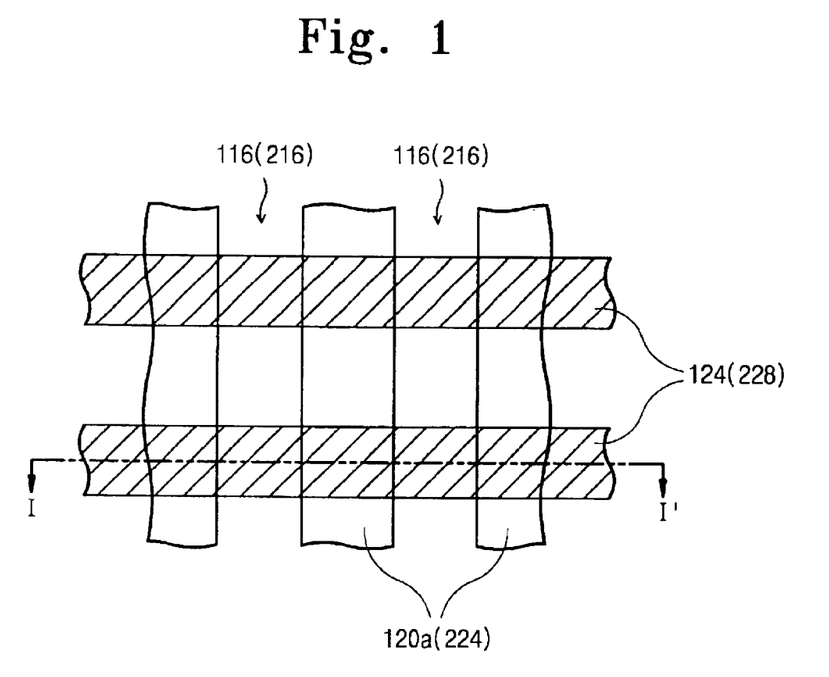
FIG. 1 is a schematic plan view illustrating a typical non-volatile memory device.

FIG. 1 is a schematic plan view illustrating a typical floating trap type non-volatile memory device.

FIGS. 2 through 5 are cross-sectional views illustrating successive process steps for forming a conventional non-volatile memory device. FIGS. 2 through 5 are taken along a line I–I' of FIG. 1. FIGS. 1 through 5 are drawings specifically illustrating a cell array area of the non-volatile memory device.

Figure 2:
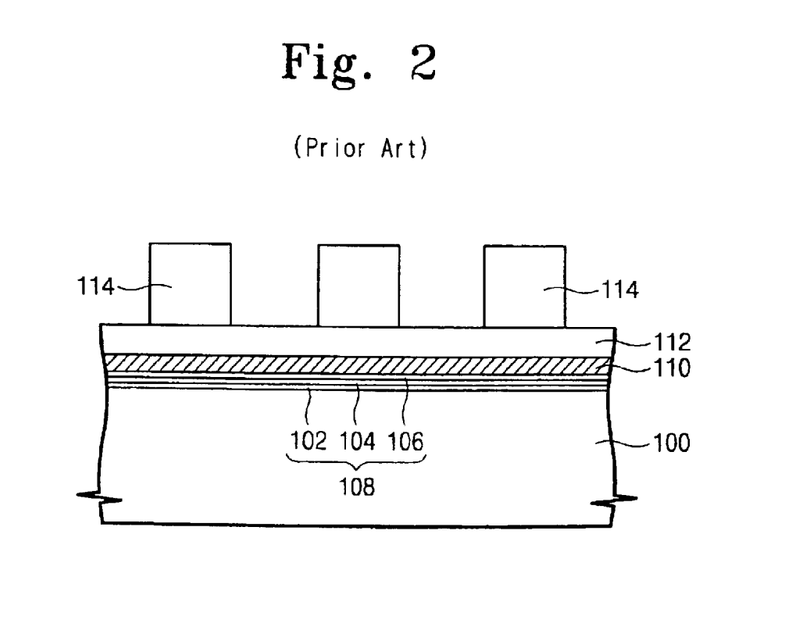
FIGS. 2 through 5 are cross-sectional views illustrating successive process steps for forming a conventional non-volatile memory device.

Referring to FIG. 2, a floating layer 108, a lower conductive layer 110 and a mask layer 112 are sequentially formed on a semiconductor substrate 100. The floating layer 108 comprises a lower dielectric layer 102, a charge storage layer 104 and an upper dielectric layer 106. Photoresist patterns 114 are formed on the mask layer 112.

Figure 3:
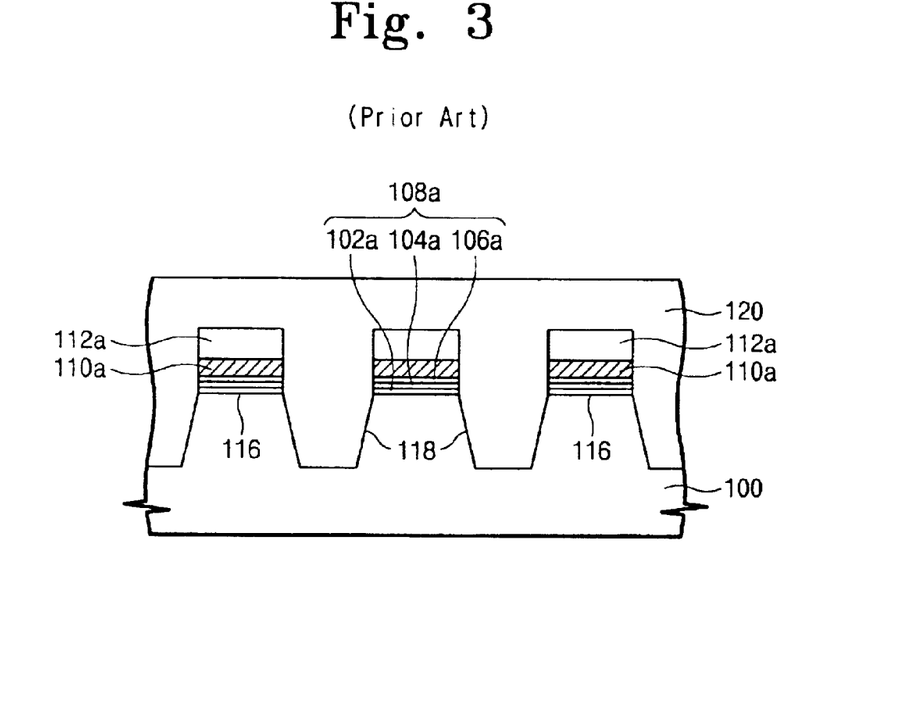

Referring to FIGS. 1 and 3, the mask layer 112, the lower conductive layer 110, the floating layer 108 and the substrate 100 are continuously etched to form trenches 118, floating regions 108a, lower conductive strips 110a and masks 112a, wherein the photoresist patterns 114 are used as etching masks. The trenches 118 define active regions 116 in the substrate 100. Each of the floating strips, i.e., floating regions 108a comprises a lower dielectric strip 102a, a charge storage strip 104a and an upper dielectric strip 106a. Subsequently, the photoresist patterns 114 are removed and an isolation layer 120 is formed to fill the trenches 118.

Figure 4:
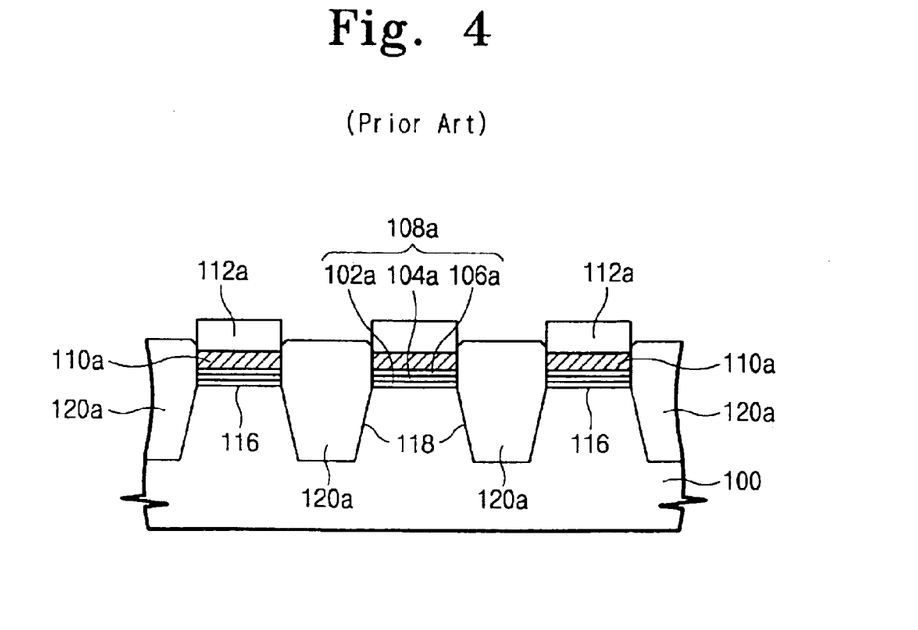

Referring to FIGS. 1 and 4, a portion of the isolation layer 120 is removed to expose top surfaces of the masks 112a to form isolation regions 120a in the trenches 118.

Figure 5:
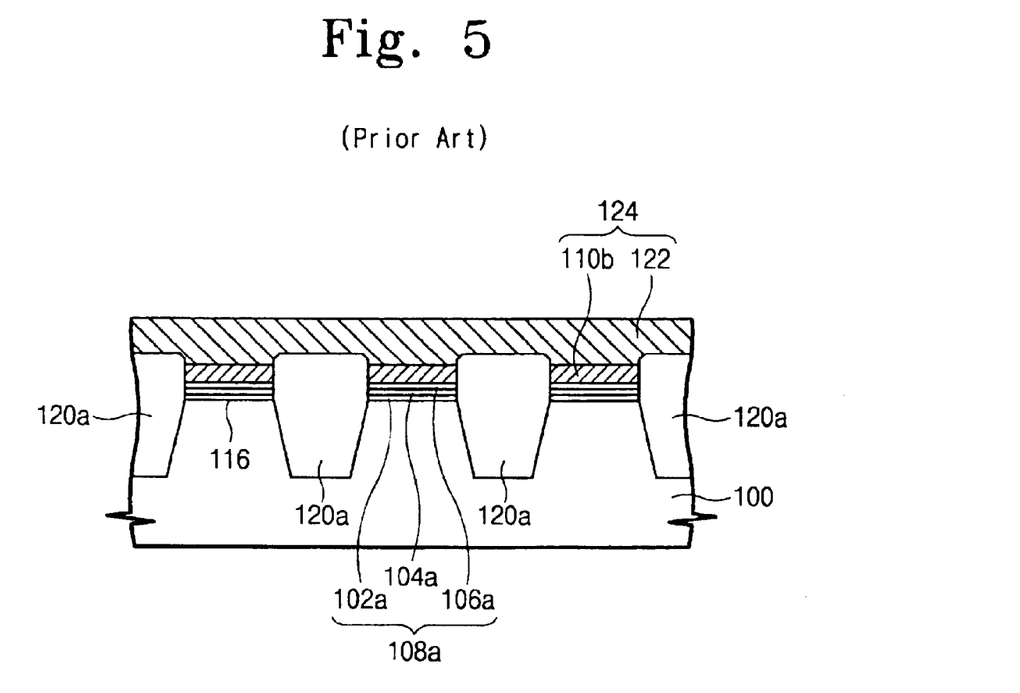

Referring to FIGS. 1 and 5, the masks 112a are removed. Subsequently, an upper conductive layer is formed on the whole surface of the resultant structure. The lower conductive strips 110a and the upper conductive layer are patterned to form gate electrodes 124. The gate electrodes 124 are disposed across the trenches 118 and the active regions 116. Each of the gate electrodes 124 comprises a lower gate electrode 110b and an upper gate electrode 122. The upper gate electrode 122 is disposed across the trenches 118 and the active regions 116. The lower gate electrode 110b is located only between the upper gate electrode 122 and the floating strips 108a.

Though not shown in the drawings, the floating regions, i.e., floating strips 108a optionally may be patterned by self-alignment techniques to the gate electrodes 124 thereby to form floating patterns 108b, which is located only between the gate electrode 124 and the active regions 116. Each of the floating patterns 108b comprises a lower dielectric pattern 102b, a charge storage pattern 104b and an upper dielectric pattern 106b.

According to the conventional non-volatile memory device, the charge storage region i.e., the charge storage strip 104a or the charge storage pattern 104b has a high defect density on the sidewall thereof. This is due to an etching damage on the sidewall during the formation of the trenches 118. The defects on the sidewall of the charge storage region may act as leakage current paths at the boundary region between the isolation region and the floating region. Therefore, the stored charges in the charge storage region may be lost through the defects.

SUMMARY OF THE INVENTION

It is an object of the present invention to provide a semiconductor device having a floating region, wherein leakage current is substantially suppressed at the boundary region between an isolation region and the floating region, so that charge loss is substantially suppressed at the boundary region.

It is another object of the present invention to provide a method for fabricating a semiconductor device having a floating region, wherein leakage current is substantially suppressed at the boundary region between an isolation region and the floating region, so that charge loss is substantially suppressed at the boundary region.

According to one aspect of the present invention, a semiconductor device is provided. The semiconductor device comprises a gate electrode formed on a substrate. A floating region is interposed between the substrate and the gate electrode. The width of the floating region is wider than that of the gate electrode. The floating region comprises a charge storage region and the width of the charge storage region is wider than that of the gate electrode. The charge storage region is preferably formed of an oxidation resistive layer. The floating region is preferably formed of an ONO layer and the charge storage region is preferably formed of a silicon nitride layer of the ONO layer. The gate electrode comprises a lower gate electrode and an upper gate electrode. The width of the charge storage region is wider than that of the lower gate electrode. An isolation region defines an active region in the substrate. The upper gate electrode is extended across the isolation region and the active region. And, the lower gate electrode is interposed between the upper gate electrode and the active region.

According to another aspect of the present invention, a semiconductor device is provided. The semiconductor device comprises an isolation region formed on a substrate. The isolation region defines an active region in the substrate. A gate electrode is formed on the active region. A floating region is interposed between the active region and the gate electrode. The width of the floating region is wider than that of the active region. The floating region comprises a charge storage region and the width of the charge storage region is wider than that of the active region. The charge storage region is preferably formed of an oxidation resistive layer. The floating region is preferably formed of an ONO layer and the charge storage region is preferably formed of a silicon nitride layer of the ONO layer. The isolation region fills a trench in the substrate. The isolation region comprises a thermally grown trench oxide at the sidewall of the trench. The gate electrode comprises a lower electrode and an upper electrode. The upper gate electrode is extended across the isolation region and the active region. And the lower gate electrode is interposed between the upper gate electrode and the active region.

According to another aspect of the present invention, a semiconductor device is provided. The semiconductor device comprises an isolation region on a substrate. The isolation region defines an active region in the substrate. A gate electrode is formed on the active region. A floating region is interposed between the active region and the gate electrode. The floating region has a protrusion portion at an end thereof. The protrusion portion extends into the isolation region and the isolation region substantially surrounds the protrusion portion. The floating region comprises a charge storage region and the charge storage region has the protrusion portion at an end thereof. The charge storage region is preferably formed of an oxidation resistive layer. The floating region is formed of an ONO layer and the charge storage region is preferably formed of a silicon nitride layer of the ONO layer. The isolation region fills a trench in the substrate. The isolation region comprises a thermally grown trench oxide at the sidewall of the trench. The gate electrode comprises a lower electrode and an upper electrode. The upper gate electrode is extended across the isolation region and the active region. The lower gate electrode is interposed between the upper gate electrode and the active region. The isolation region comprises a thermally grown sidewall oxide at an end of the lower gate electrode.

According to another aspect of the present invention, a method for forming a semiconductor device is provided. The method comprises forming a floating strip on a portion of a substrate. The floating strip comprises a charge storage strip made of an oxidation resistive layer. A lower conductive strip is formed on the floating strip. The lower conductive strip has a sidewall. A trench is formed in another portion of the substrate. The trench has a sidewall and the trench defines an active region. A trench oxide is formed on the sidewall of the trench to reduce the width of the active region. A sidewall oxide is formed on the sidewall of the lower conductive strip to reduce the width of the lower conductive strip. An isolation pattern is formed to fill the trench. The width of the charge storage strip is greater that the width of the lower conductive strip and the width of the active region. The floating strip is preferably formed of an ONO layer and the charge storage strip is preferably formed of a silicon nitride layer of the ONO layer. The ONO layer comprising an upper silicon oxide layer which is a CVD oxide layer. The trench oxide and the sidewall oxide are formed by a thermal oxidation method. The formation of the isolation pattern comprises forming a mask on the lower conductive strip, forming an isolation layer on the mask and in the trench and removing a portion of the isolation layer to expose the mask. The mask comprises a material selected from the group consisting silicon nitride and silicon oxide. An upper conductive strip is formed on the lower conductive strip and the isolation pattern. The upper conductive strip is disposed across the isolation pattern and the active region. A portion of the lower conductive strip is removed to form a lower electrode. The lower electrode is located in an overlapping area of the upper conductive strip and the active region. The upper conductive strip is an upper electrode. The upper conductive strip is preferably made of polysilicon or polycide. The lower conductive strip is preferably made of polysilicon.

BRIEF DESCRIPTION OF THE DRAWINGS

Other features of the present invention will be more readily understood from the following detail description of specific embodiment thereof when read in conjunction with the accompanying drawings, in which.

DESCRIPTION OF THE PREFERRED EMBODIMENT

Preferred embodiments of the present invention will be described hereinafter with reference to the accompanying drawings, even though the scope of the present invention is not limited to the embodiments.

FIG. 1 is a schematic plan view illustrating a typical floating trap type non-volatile memory device. The plan view of the present invention is substantially same as that of the conventional non-volatile memory device. But, the vertical structure of the present invention is totally unique, compared to that of the conventional device as described below. FIGS. 6 through 11 are cross-sectional views illustrating successive process steps according to the present invention, being taken along a line I–I' of FIG. 1. FIGS. 1 and 6 through 11 are drawings specifically illustrating a cell array area of a non-volatile memory device.

Figure 6:
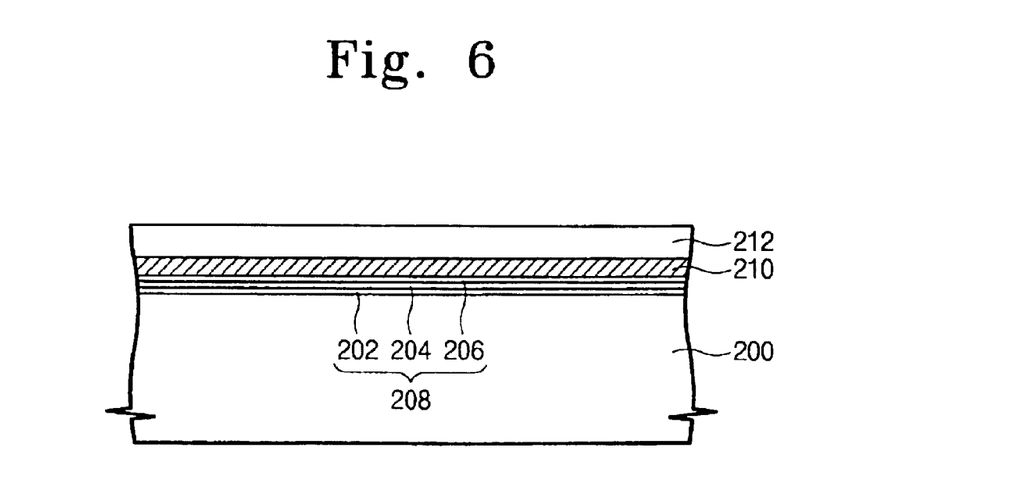
FIGS. 6 through 11 are cross-sectional views illustrating successive process steps for forming a floating trap type non-volatile memory device according to the present invention.

Referring to FIG. 6, a floating layer 208, a lower conductive layer 210 and a mask layer 212 are sequentially formed on a semiconductor substrate 200. The floating layer 208 comprises a lower dielectric layer 202, a charge storage layer 204 and an upper dielectric layer 206. The floating layer 208 is preferably an ONO layer. The lower dielectric layer 202 is preferably a tunnel oxide made by a thermal oxidation method. The lower dielectric layer 202 is preferably thin so that tunneling readily occurs by relatively low voltages during a program and an erasure operation. The thickness of the lower dielectric layer 202 is preferably within 30~50 Å. The charge storage layer 204 has a high trap density. Moreover, the charge storage layer 204 is an oxidation resistive layer, i.e., the charge storage layer 204 is not easily oxidized. The charge storage layer 204 is preferably a silicon nitride layer. The upper dielectric layer 206 is preferably a blocking oxide layer made by a CVD (Chemical Vapor Deposition) method. The thickness of the upper dielectric layer 206 is preferably within 40~120 Å. The upper dielectric layer 206 has a good electrical isolation characteristic. The lower conductive layer 210 is preferably a polysilicon layer. The mask layer 212 has a high etch selectivity for a selected etching condition of the substrate 200. The mask layer 212 is preferably a silicon nitride layer or a composite layer having a silicon nitride layer and a silicon oxide layer.

Figure 7:
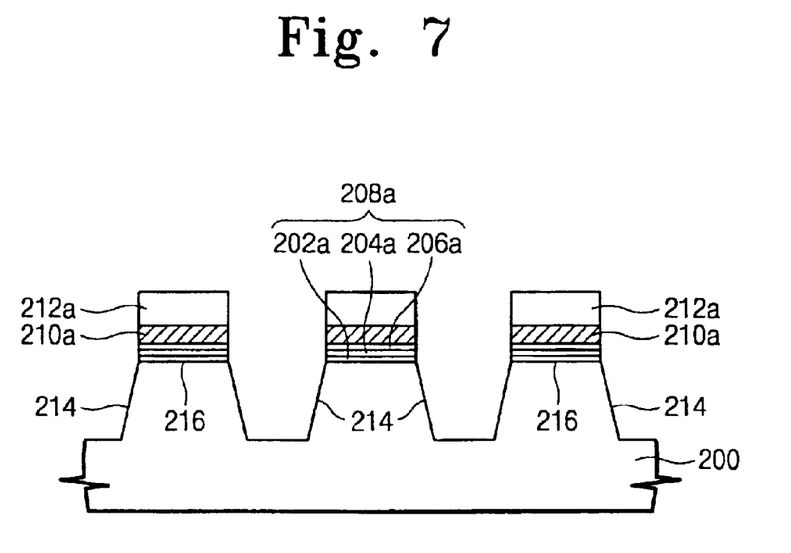

Referring to FIGS. 1 and 7, the mask layer 212, the lower conductive layer 210, the floating layer 208 and the substrate 200 are continuously etched to form trenches 214, floating regions 208a, lower conductive strips 210a and masks 212a.

The floating regions 208a are strips that extend parallel with the trenches 214. The trenches 214 define active regions 216 in the substrate 200. The active regions 216 are covered by the floating regions 208a, the lower conductive regions 210a and the masks 212a. Each of the floating regions, i.e., the floating strips 208a, comprises lower dielectric strips 202a, charge storage strips 204a and upper dielectric strips 206a.

Figure 8:
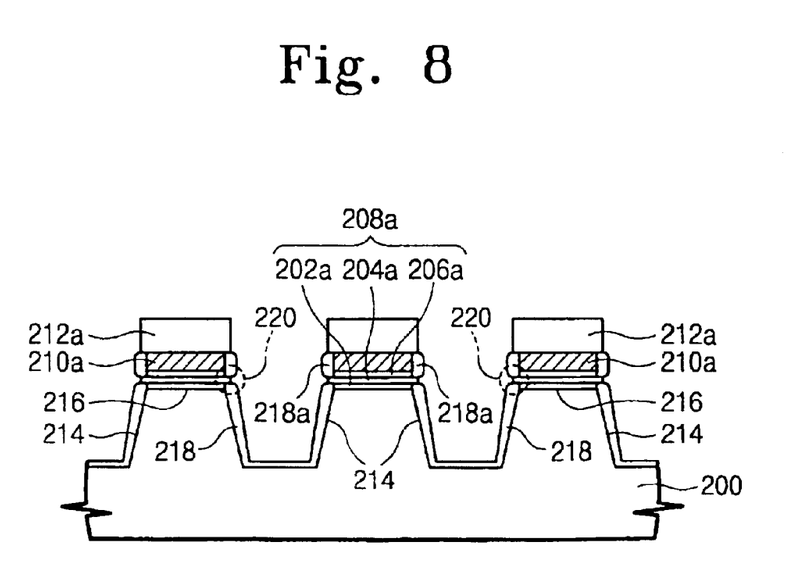

Referring to FIG. 8, bottom surfaces and sidewalls of the trenches 214 are thermally oxidized to form a trench oxide 218 thereon. At this moment, sidewalls of the lower conductive patterns 210a are also oxidized to form a sidewall oxide 218a thereon. As a result of the oxidation, the widths of the active regions 216 and the lower conductive strips 210a become narrow. However, the charge storage strips 204a are not significantly oxidized. As a result, each of the floating strips 204a has a protrusion portion 220 at its ends. The thermal oxidation for forming the trench oxide 218 also acts to substantially cure any damage incurred on the sidewalls of the lower dielectric strips 202a and the upper dielectric strips 206a. Such damage may occur during the previous etching step for forming the trenches 214.

Figure 9:
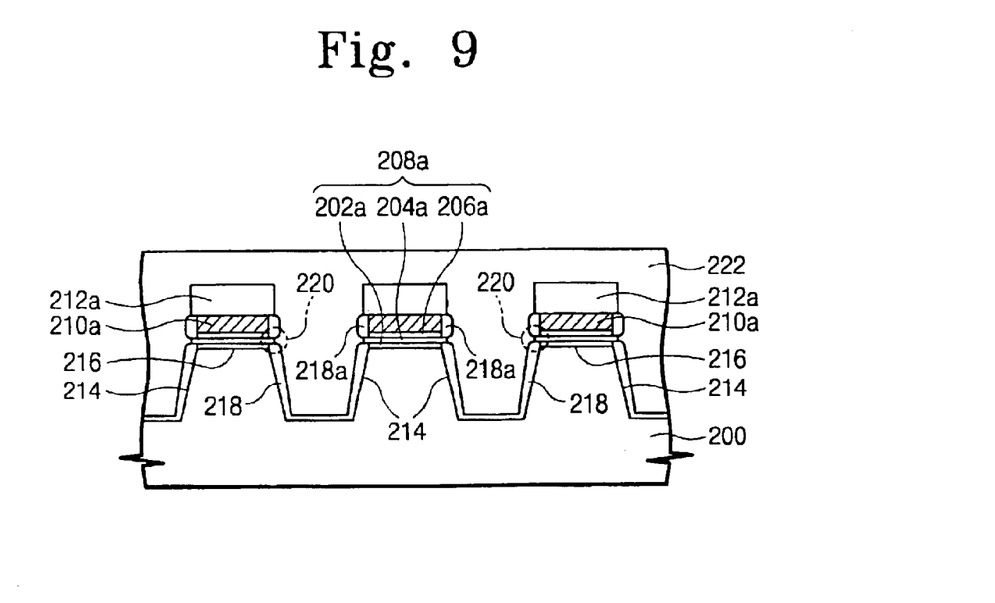

Referring to FIG. 9, an isolation layer 222 is formed to fill the trenches 214. The isolation layer 222 is made of an electrically insulating material that can easily fill the trenches 214. The isolation layer 222 is preferably a HDP (High Density Plasma) oxide layer or an ozone-TEOS layer.

Figure 10:
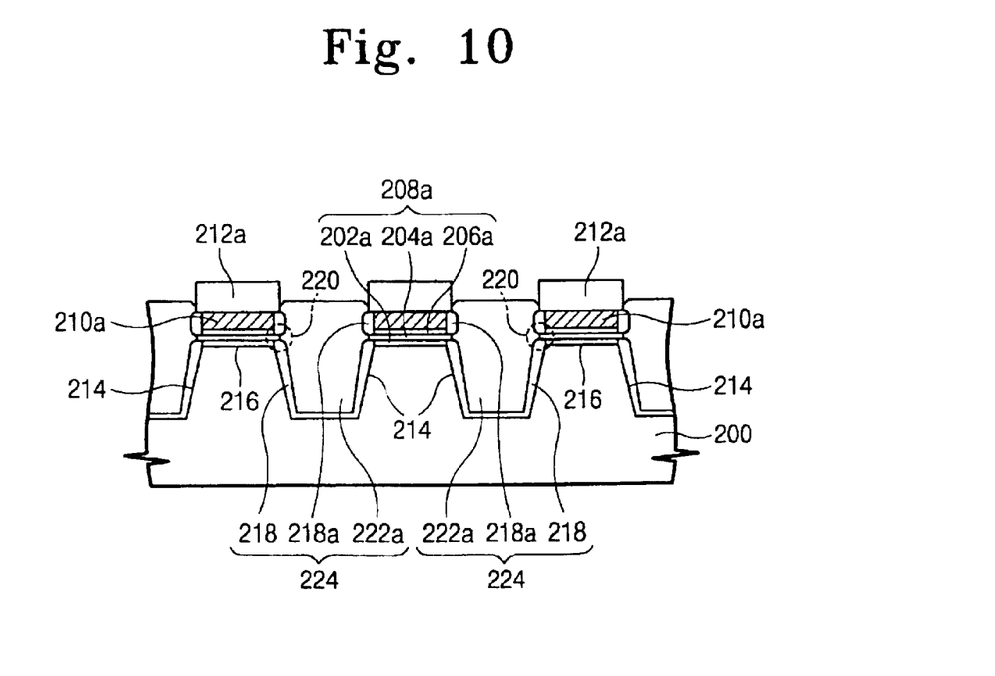

Referring to FIGS. 1 and 10, a portion of the isolation layer 222 is removed to expose top surfaces of the masks 212a to form isolation patterns 222a in the trenches 214. Each isolation pattern 222a, trench oxide 218 and sidewall oxide 218a constitutes an isolation region 224.

Figure 11:
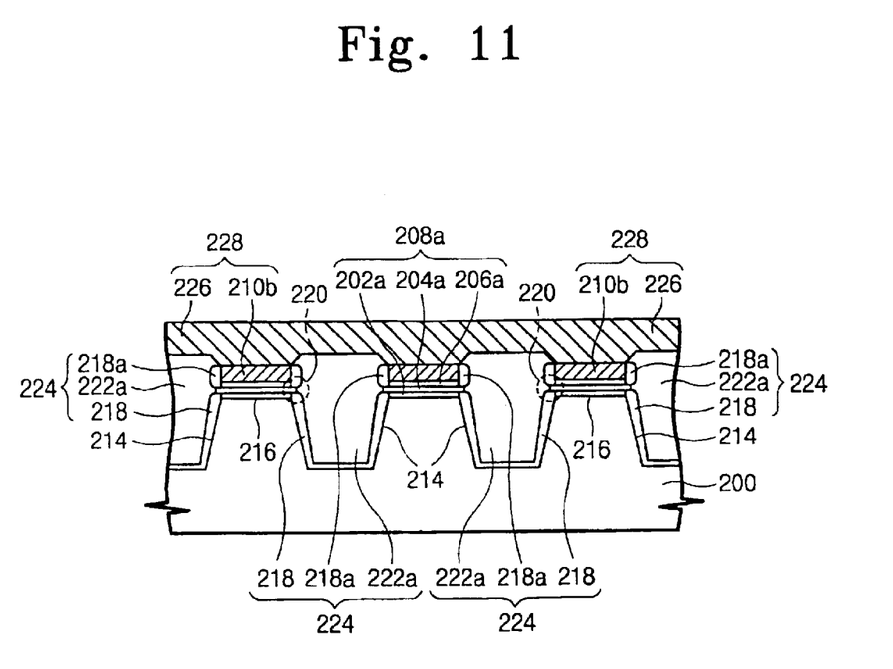

Referring to FIGS. 1 and 11, the masks 212a are removed. Subsequently, a second conductive layer is formed on the whole surface of the resultant structure. The second conductive layer is preferably a polysilicon layer or a polycide layer. The lower conductive patterns 210a and the second conductive layer are patterned to form gate electrodes 228. The gate electrodes 228 are disposed across the trenches 214 and the active regions 216. Each of the gate electrodes 228 comprises a lower gate electrode 210b and an upper gate electrode 226. The upper gate electrode 226 is disposed across the trenches 214 and the active regions 216. The lower gate electrode 210b is interposed only between the second gate electrode 226 and the floating region 208a.

Optionally, though not shown, the charge storage strips 204a and the upper dielectric strips 206a may be patterned by self-alignment techniques to the gate electrodes 228 to form the charge storage patterns and the upper dielectric patterns. In this case, the charge storage patterns and the upper dielectric patterns are located only between the gate electrodes 228 and the active regions 216. Otherwise, the entire floating strips 208a may be patterned by self-alignment techniques to the gate electrodes 228 to form the floating patterns. In this case, the floating patterns are located only between the gate electrodes 228 and the active regions 216.

Figure 12:
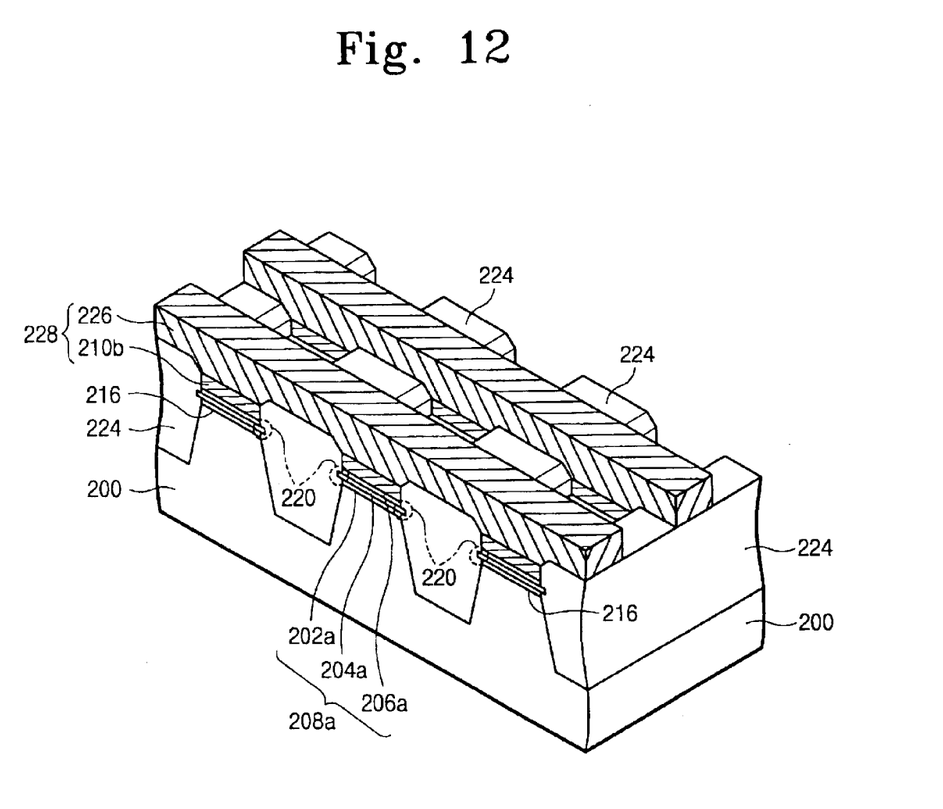
FIG. 12 is a fragmentary cross-sectional isometric view illustrating the floating trap type non-volatile memory device according to the present invention.

FIG. 12 is a fragmentary cross-sectional isometric view illustrating the floating trap type non-volatile memory device according to the present invention.

Referring to FIG. 12, isolation regions 224 are formed on a semiconductor substrate 200. The isolation regions 224 define active regions 216 in the substrate 200. Gate electrodes 228 are formed across the isolation regions 224 and the active regions 216. Floating regions 208a intervene between the gate electrodes 228 and the active regions 216. Each of the floating regions 208a comprises a lower dielectric region 202a, a charge storage region 204a and an upper dielectric region 206a. Each of the gate electrodes 228 comprises a lower gate electrode 210b and an upper gate electrode 226. As shown in the drawings, each of the charge storage regions 204a has a protrusion portion 220 at its ends.

The floating region 208a may be a floating strip or a floating pattern. The floating pattern is self-aligned to the gate electrodes 228. Otherwise, the floating regions 208a may comprise a lower dielectric strip, a charge storage pattern and an upper dielectric pattern. The charge storage pattern and the upper dielectric pattern are self-aligned to the gate electrodes 228.

According to the present invention, each of the charge storage regions 204a has a protrusion portion 220 at its ends. The protrusion portion 220 is surrounded by the isolation regions 224. Therefore, electric field induced on the sidewall of the charge storage regions 204a is decreased compared to the conventional floating trap type non-volatile memory device. Moreover, the thermal oxidation for forming the trench oxide 218 can cure damage to the sidewalls of the lower dielectric regions 202a and the upper dielectric regions 206a. Accordingly, the floating region 208a has a substantially lower defect density on its sidewall. As a result, leakage current can be substantially suppressed at the boundary region between the isolation region and the floating region.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method of fabricating a semiconductor device, comprising the steps of:

providing a substrate;

forming a floating strip on a portion of the substrate, wherein the floating strip comprises a charge storage strip made of an oxidation resistive layer;

forming a lower conductive strip on the floating strip, wherein the lower conductive strip has a sidewall;

forming a trench in another portion of the substrate, wherein the trench has a sidewall and the trench defines an active region;

forming a trench oxide on the sidewall of the trench to reduce the width of the active region;

forming a sidewall oxide on the sidewall of the lower conductive strip to reduce the width of the lower conductive strip; and forming an isolation pattern to fill the trench.

2. The method of claim 1, wherein the width of the charge storage strip is greater than the width of the lower conductive strip and the width of the reduced active region.

3. The method of claim 1, wherein the floating strip is formed of an ONO layer and the charge storage strip is formed of a silicon nitride layer of the ONO layer.

4. The method of claim 3, wherein the ONO layer comprising an upper silicon oxide layer which is a CVD oxide layer.

5. The method of claim 1, wherein the trench oxide and the sidewall oxide are formed by a thermal oxidation method.

6. The method of claim 1, which further comprises forming a mask on the lower conductive strip, wherein the formation of the isolation pattern comprises:

forming an isolation layer on the mask and in the trench; and removing a portion of the isolation layer to expose the mask.

7. The method of claim 6, wherein the mask comprises a material selected from the group consisting silicon nitride and silicon oxide.

8. The method of claim 1, which further comprises:

forming an upper conductive strip on the lower conductive strip and the isolation pattern, wherein the upper conductive strip is disposed across the isolation pattern and the active region; and removing a portion of the lower conductive strip to form a lower electrode, wherein the lower electrode is located an overlapping area of the upper conductive strip and the active region, and wherein the upper conductive strip is an upper electrode.

9. The method of claim 8, wherein the upper conductive strip is made of polysilicon or polycide.

10. The method of claim 1, wherein the lower conductive strip is made of polysilicon.

11. A method of fabricating a semiconductor device, comprising:

providing a substrate;

sequentially forming a floating layer, a lower conductive layer and a mask layer on the substrate;

continuously etching the mask layer, the lower conductive layer, the floating layer and the substrate, thereby forming trenches, floating strips, lower conductive strips and masks, wherein the trenches define active regions in the substrate, and wherein each of the lower conductive strips and each of the masks are sequentially stacked on corresponding one of the active regions;

forming a trench oxide on each sidewall of the trenches, and a sidewall oxide on each sidewall of the lower conductive strips to reduce the width of the active regions; and forming isolation patterns to fill the trenches.

12. The method of claim 11, wherein the floating layer is formed of a lower dielectric layer, a charge storage layer and an upper dielectric layer.

13. The method of claim 12, wherein both the lower dielectric layer and the upper dielectric layer are formed of oxide, and the charge storage layer is formed of silicon nitride.

14. The method of claim 11, wherein the forming of the isolation patterns comprises;

forming an isolation layer on the masks to fill the trenches; and removing a portion of the isolation layer to expose the mask.

15. The method of claim 11, after formation the isolation patterns, further comprises;

removing the masks to expose the lower conductive strips;

forming an upper conductive layer on the lower conductive strips and the isolation patterns; and sequentially patterning the upper conductive layer and the lower conductive strips to form upper conductive strips and lower electrodes, wherein each of the upper conductive strips is disposed across the isolation patterns, and each of the lower electrodes is located at an overlapping area of corresponding one of the upper conductive strips and corresponding one of the active regions.

16. The method of claim 15, wherein the upper conductive layer is made of polysilicon or polycide.

17. The method of claim 11, wherein the lower conductive layer is made of polysilicon.

* * * * *